(12) United States Patent
Liu et al.

(10) Patent No.: US 10,858,727 B2
(45) Date of Patent: Dec. 8, 2020

(54) HIGH DENSITY, LOW STRESS AMORPHOUS CARBON FILM, AND PROCESS AND EQUIPMENT FOR ITS DEPOSITION

(71) Applicant: Applied Materials, Inc., Santa Clara, CA (US)

(72) Inventors: Jingjing Liu, Milpitas, CA (US); Zhong Qiang Hua, Saratoga, CA (US); Adolph Miller Allen, Oakland, CA (US); Michael W. Stowell, Loveland, CO (US); Srinivas D. Nemani, Sunnyvale, CA (US); Chentsau Ying, Cupertino, CA (US); Bhargav Citla, Fremont, CA (US); Viachslav Babayan, Sunnyvale, CA (US); Andrej Halabica, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 164 days.

(21) Appl. No.: 15/600,247

(22) Filed: May 19, 2017

(65) Prior Publication Data
US 2018/0051368 A1    Feb. 22, 2018

Related U.S. Application Data

(60) Provisional application No. 62/377,325, filed on Aug. 19, 2016.

(51) Int. Cl.
*H01J 37/34* (2006.01)
*C23C 14/06* (2006.01)
(Continued)

(52) U.S. Cl.
CPC ...... *C23C 14/0605* (2013.01); *C23C 14/3485* (2013.01); *C23C 14/35* (2013.01);
(Continued)

(58) Field of Classification Search
CPC ............. H01J 37/32724; H01J 37/3426; H01J 37/3435; H01J 37/3452; H01J 37/3467;
(Continued)

(56) References Cited

U.S. PATENT DOCUMENTS 5,812,403 A   9/1998 Fong et al.
5,935,340 A   8/1999 Xia et al.
(Continued)

FOREIGN PATENT DOCUMENTS

JP   2007-530787 A   11/2007
JP   2011-214150 A   10/2011
(Continued)

OTHER PUBLICATIONS

Roy et al., "Diamond like carbon films deposited from graphite target by asymmetric bipolar pulsed-DC magnetron sputtering", Diamond & Related Materials 16 (2007) 1286-1290. (Year: 2007).*
(Continued)

*Primary Examiner* — Rodney G McDonald
(74) *Attorney, Agent, or Firm* — Kilpatrick Townsend & Stockton LLP

(57) ABSTRACT

A deposited amorphous carbon film includes at least 95% carbon. A percentage of sp3 carbon-carbon bonds present in the amorphous carbon film exceeds 30%, and a hydrogen content of the amorphous carbon film is less than 5%. A process of depositing amorphous carbon on a workpiece includes positioning the workpiece within a process chamber and positioning a magnetron assembly adjacent to the process chamber. The magnetron assembly projects a magnetic field into the process chamber. The method further includes providing a carbon target such that the magnetic field extends through the carbon target toward the workpiece. The method further includes providing a source gas to the process chamber, and providing pulses of DC power to
(Continued)

a plasma formed from the source gas within the process chamber. The pulses of DC power are supplied in pulses of 40 microseconds or less, that repeat at a frequency of at least 4 kHz.

9 Claims, 7 Drawing Sheets

(51) Int. Cl.
  *C23C 14/35* (2006.01)
  *H01J 37/32* (2006.01)
  *C23C 14/54* (2006.01)
  *H01L 21/311* (2006.01)
  *H01L 21/02* (2006.01)
  *H01L 21/033* (2006.01)
  *C23C 14/34* (2006.01)

(52) U.S. Cl.
  CPC .......... *C23C 14/354* (2013.01); *C23C 14/541* (2013.01); *C23C 14/542* (2013.01); *H01J 37/32724* (2013.01); *H01J 37/3426* (2013.01); *H01J 37/3435* (2013.01); *H01J 37/3452* (2013.01); *H01J 37/3467* (2013.01); *H01L 21/02115* (2013.01); *H01L 21/02266* (2013.01); *H01L 21/0332* (2013.01); *H01L 21/31144* (2013.01)

(58) Field of Classification Search
  CPC . C23C 14/0605; C23C 14/3485; C23C 14/35; C23C 14/354; C23C 14/541; C23C 14/542
  USPC ............ 204/298.09, 298.03, 298.06, 298.08, 204/298.17, 298.18, 298.19, 298.2
  See application file for complete search history.

(56) References Cited

U.S. PATENT DOCUMENTS

| | | | |
|---|---|---|---|
| 5,963,840 A | 10/1999 | Xia et al. | |
| 6,063,245 A | 5/2000 | Frach et al. | |
| 6,086,730 A * | 7/2000 | Liu ..................... | C23C 14/0605 204/192.12 |
| 6,090,206 A | 7/2000 | Bang et al. | |
| 6,114,216 A | 9/2000 | Yieh et al. | |
| 6,265,318 B1 | 7/2001 | Hwang et al. | |
| 6,323,132 B1 | 11/2001 | Hwang et al. | |
| 6,338,777 B1 | 1/2002 | Longstreth White | |
| 6,347,636 B1 | 2/2002 | Xia et al. | |
| 6,348,099 B1 | 2/2002 | Xia et al. | |
| 6,352,591 B1 | 3/2002 | Yieh et al. | |
| 6,372,291 B1 | 4/2002 | Hua et al. | |
| 6,413,583 B1 | 7/2002 | Moghadam et al. | |
| 6,465,366 B1 | 10/2002 | Nemani et al. | |
| 6,531,398 B1 | 3/2003 | Gaillard et al. | |
| 6,596,343 B1 | 7/2003 | Pokharna et al. | |
| 6,764,958 B1 | 7/2004 | Nemani et al. | |
| 6,878,620 B2 | 4/2005 | Nguyen et al. | |
| 8,748,322 B1 | 6/2014 | Fung et al. | |
| 9,460,959 B1 | 10/2016 | Xie et al. | |
| 9,484,202 B1 | 11/2016 | Zhou et al. | |
| 9,716,005 B1 | 7/2017 | Godet et al. | |
| 2002/0119250 A1 | 8/2002 | Campana et al. | |
| 2002/0142104 A1 | 10/2002 | Nemani et al. | |
| 2002/0155730 A1 | 10/2002 | Mukai et al. | |
| 2003/0008069 A1 | 1/2003 | Nemani et al. | |
| 2003/0017087 A1 | 1/2003 | Pokharna et al. | |
| 2003/0022494 A1 | 1/2003 | Ying et al. | |
| 2003/0029475 A1 | 2/2003 | Hua et al. | |
| 2003/0036264 A1 | 2/2003 | Ying et al. | |
| 2003/0059720 A1 | 3/2003 | Hwang et al. | |
| 2003/0129827 A1 | 7/2003 | Lee et al. | |
| 2003/0148020 A1 | 8/2003 | Campana et al. | |
| 2003/0148223 A1 | 8/2003 | Campana et al. | |
| 2003/0192568 A1 | 10/2003 | Zheng et al. | |
| 2003/0194880 A1 | 10/2003 | Singh et al. | |
| 2003/0203637 A1 | 10/2003 | Hua et al. | |
| 2003/0211244 A1 | 11/2003 | Li et al. | |
| 2003/0219912 A1 | 11/2003 | Chen et al. | |
| 2003/0219984 A1 | 11/2003 | Ying et al. | |
| 2003/0221621 A1 | 12/2003 | Pokharna et al. | |
| 2004/0026235 A1 | 2/2004 | Stowell | |
| 2004/0029393 A1 | 2/2004 | Ying et al. | |
| 2004/0043526 A1 | 3/2004 | Ying et al. | |
| 2004/0043620 A1 | 3/2004 | Ying et al. | |
| 2004/0065645 A1 | 4/2004 | Welch et al. | |
| 2004/0067308 A1 | 4/2004 | Zheng et al. | |
| 2004/0082193 A1 | 4/2004 | Rocha-Alvarez et al. | |
| 2004/0092095 A1 | 5/2004 | Nguyen et al. | |
| 2004/0101633 A1 | 5/2004 | Zheng et al. | |
| 2004/0126952 A1 | 7/2004 | Gondhalekar et al. | |
| 2004/0129361 A1 | 7/2004 | Chen et al. | |
| 2004/0137749 A1 | 7/2004 | Ying et al. | |
| 2004/0152338 A1 | 8/2004 | Gaillard et al. | |
| 2004/0156987 A1 | 8/2004 | Yim et al. | |
| 2004/0157459 A1 | 8/2004 | Ying et al. | |
| 2004/0173570 A1 | 9/2004 | Ying et al. | |
| 2004/0209476 A1 | 10/2004 | Ying et al. | |
| 2004/0231798 A1 | 11/2004 | Gondhalekar et al. | |
| 2005/0020048 A1 | 1/2005 | Nemani et al. | |
| 2005/0079715 A1 | 4/2005 | Hua et al. | |
| 2005/0153073 A1 | 7/2005 | Zheng et al. | |
| 2005/0211265 A1 | 9/2005 | Zheng et al. | |
| 2005/0233576 A1 | 10/2005 | Lee et al. | |
| 2005/0266655 A1 | 12/2005 | Nemani et al. | |
| 2006/0046508 A1 | 3/2006 | Nemani et al. | |
| 2006/0141805 A1 | 6/2006 | Nemani et al. | |
| 2006/0178003 A1 | 8/2006 | Krishnaraj et al. | |
| 2006/0198769 A1 | 9/2006 | Pokharna et al. | |
| 2007/0048446 A1 | 3/2007 | Gondhalekar et al. | |
| 2007/0054504 A1 | 3/2007 | Chen et al. | |
| 2007/0087522 A1 | 4/2007 | Nemani et al. | |
| 2007/0098916 A1 | 5/2007 | Stowell | |
| 2007/0102286 A1 | 5/2007 | Scheible et al. | |
| 2007/0181063 A1 | 8/2007 | Ritchie et al. | |
| 2007/0243693 A1 | 10/2007 | Nemani et al. | |
| 2007/0281448 A1 | 12/2007 | Chen et al. | |
| 2007/0281495 A1 | 12/2007 | Mallick et al. | |
| 2007/0283884 A1 | 12/2007 | Tiller et al. | |
| 2007/0298585 A1 | 12/2007 | Lubomirsky et al. | |
| 2008/0026597 A1 | 1/2008 | Munro et al. | |
| 2008/0057740 A1 | 3/2008 | Munro et al. | |
| 2008/0060938 A1 | 3/2008 | Miller et al. | |
| 2008/0102640 A1 | 5/2008 | Hassan | |
| 2008/0111490 A1 | 5/2008 | Stowell et al. | |
| 2008/0121177 A1 | 5/2008 | Bang | |
| 2008/0121178 A1 | 5/2008 | Bang | |
| 2008/0142483 A1 | 6/2008 | Hua et al. | |
| 2008/0185284 A1 | 8/2008 | Chen et al. | |
| 2008/0188087 A1 | 8/2008 | Chen et al. | |
| 2008/0188090 A1 | 8/2008 | Chen et al. | |
| 2008/0264783 A1 * | 10/2008 | Murphy .................. | C23C 14/35 204/298.2 |
| 2008/0308416 A1 | 12/2008 | Allen et al. | |
| 2009/0035918 A1 | 2/2009 | Chen et al. | |
| 2009/0042407 A1 | 2/2009 | Bang et al. | |
| 2009/0050468 A1 | 2/2009 | Allen | |
| 2009/0061647 A1 | 3/2009 | Mallick et al. | |
| 2009/0104755 A1 | 4/2009 | Mallick et al. | |
| 2009/0104789 A1 | 4/2009 | Mallick et al. | |
| 2009/0104791 A1 | 4/2009 | Nemani et al. | |
| 2009/0208715 A1 | 8/2009 | Stowell et al. | |
| 2009/0208880 A1 | 8/2009 | Nemani et al. | |
| 2009/0215281 A1 | 8/2009 | Mungekar et al. | |
| 2009/0238993 A1 | 9/2009 | Stowell et al. | |
| 2009/0238998 A1 | 9/2009 | Stowell et al. | |
| 2009/0277778 A1 | 11/2009 | Stowell et al. | |
| 2009/0283400 A1 | 11/2009 | Stowell et al. | |
| 2009/0288943 A1 | 11/2009 | Kwak et al. | |
| 2010/0065216 A1 | 3/2010 | Tiller | |
| 2010/0075033 A1 | 3/2010 | Stowell | |

(56) References Cited

U.S. PATENT DOCUMENTS

| | | |
|---|---|---|
| 2010/0078315 A1 | 4/2010 | Stowell et al. |
| 2010/0078320 A1 | 4/2010 | Stowell et al. |
| 2010/0081293 A1 | 4/2010 | Mallick et al. |
| 2010/0095979 A1 | 4/2010 | Hua et al. |
| 2010/0105204 A1 | 4/2010 | Lam et al. |
| 2010/0252417 A1 | 10/2010 | Allen et al. |
| 2010/0255655 A1 | 10/2010 | Mallick et al. |
| 2011/0014798 A1 | 1/2011 | Mallick et al. |
| 2011/0036709 A1 | 2/2011 | Hawrylchak |
| 2011/0076420 A1 | 3/2011 | Stowell |
| 2011/0076422 A1 | 3/2011 | Stowell |
| 2011/0097517 A1 | 4/2011 | Stowell |
| 2011/0129990 A1 | 6/2011 | Mandrekar et al. |
| 2011/0151590 A1 | 6/2011 | Carducci et al. |
| 2011/0209995 A1 | 9/2011 | Rasheed et al. |
| 2011/0223760 A1 | 9/2011 | Hua et al. |
| 2011/0297538 A1 | 12/2011 | Miller et al. |
| 2011/0305912 A1 | 12/2011 | Teer et al. |
| 2012/0015113 A1 | 1/2012 | Hua et al. |
| 2012/0045631 A1 | 2/2012 | Stowell et al. |
| 2012/0058281 A1 | 3/2012 | Hua et al. |
| 2012/0077344 A1 | 3/2012 | Zhou et al. |
| 2012/0148761 A1 | 6/2012 | Stowell et al. |
| 2012/0208371 A1 | 8/2012 | Rogers et al. |
| 2013/0023122 A1 | 1/2013 | Nemani et al. |
| 2013/0023123 A1 | 1/2013 | Zhou et al. |
| 2013/0023124 A1 | 1/2013 | Nemani et al. |
| 2013/0040464 A1 | 2/2013 | Zhou et al. |
| 2013/0075246 A1 | 3/2013 | Ge et al. |
| 2013/0087452 A1 | 4/2013 | Hawrylchak et al. |
| 2013/0105303 A1 | 5/2013 | Lubomirsky et al. |
| 2013/0109172 A1 | 5/2013 | Collins et al. |
| 2013/0109187 A1 | 5/2013 | Nemani et al. |
| 2013/0192980 A1 | 8/2013 | Ge et al. |
| 2013/0199925 A1 | 8/2013 | Cao et al. |
| 2013/0248352 A1 | 9/2013 | Jiang et al. |
| 2013/0252440 A1 | 9/2013 | Luo et al. |
| 2014/0017898 A1 | 1/2014 | Nemani et al. |
| 2014/0038431 A1 | 2/2014 | Stowell et al. |
| 2014/0120726 A1 | 5/2014 | Nemani et al. |
| 2014/0170856 A1 | 6/2014 | Nemani et al. |
| 2014/0186544 A1 | 7/2014 | Hua |
| 2014/0187035 A1 | 7/2014 | Posseme et al. |
| 2014/0187038 A1 | 7/2014 | Collins et al. |
| 2014/0187045 A1 | 7/2014 | Hua |
| 2014/0187046 A1 | 7/2014 | Posseme et al. |
| 2014/0199851 A1 | 7/2014 | Nemani et al. |
| 2014/0213060 A1 | 7/2014 | Kao et al. |
| 2014/0263173 A1 | 9/2014 | Rosslee et al. |
| 2014/0273496 A1 | 9/2014 | Kao et al. |
| 2014/0342532 A1 | 11/2014 | Zhu et al. |
| 2014/0342569 A1 | 11/2014 | Zhu et al. |
| 2014/0357083 A1 | 12/2014 | Ling et al. |
| 2015/0042017 A1 | 2/2015 | Ramaswamy et al. |
| 2015/0056814 A1 | 2/2015 | Ling et al. |
| 2015/0079798 A1 | 3/2015 | Ling et al. |
| 2015/0093907 A1 | 4/2015 | Yieh et al. |
| 2015/0099360 A1 | 4/2015 | Yieh et al. |
| 2015/0099369 A1 | 4/2015 | Deshmukh et al. |
| 2015/0108619 A1 | 4/2015 | Nemani |
| 2015/0118822 A1 | 4/2015 | Zhang et al. |
| 2015/0126041 A1 | 5/2015 | Chatterjee et al. |
| 2015/0140827 A1 | 5/2015 | Kao et al. |
| 2015/0147879 A1 | 5/2015 | Chatterjee et al. |
| 2015/0170879 A1 | 6/2015 | Nguyen et al. |
| 2015/0170924 A1 | 6/2015 | Nguyen et al. |
| 2015/0170943 A1 | 6/2015 | Nguyen et al. |
| 2015/0179581 A1 | 6/2015 | Chen et al. |
| 2015/0194317 A1 | 7/2015 | Manna et al. |
| 2015/0200042 A1 | 7/2015 | Ling et al. |
| 2015/0214066 A1 | 7/2015 | Luere |
| 2015/0214101 A1 | 7/2015 | Ren et al. |
| 2015/0214475 A1 | 7/2015 | Gouk et al. |
| 2015/0221541 A1 | 8/2015 | Nemani et al. |
| 2015/0262834 A1 | 9/2015 | Belostotskiy et al. |
| 2015/0262869 A1 | 9/2015 | Naik et al. |
| 2015/0279687 A1 | 10/2015 | Xue et al. |
| 2015/0287612 A1 | 10/2015 | Luere et al. |
| 2015/0292622 A1 | 10/2015 | Kennedy et al. |
| 2015/0315707 A1 | 11/2015 | Xue et al. |
| 2015/0348757 A1 | 12/2015 | Stowell et al. |
| 2015/0348902 A1 | 12/2015 | Naik et al. |
| 2015/0351166 A1 | 12/2015 | Stowell |
| 2015/0371852 A1 | 12/2015 | Zhang et al. |
| 2015/0380223 A1 | 12/2015 | Scheible |
| 2016/0005839 A1 | 1/2016 | Yieh et al. |
| 2016/0027655 A1 | 1/2016 | Chen et al. |
| 2016/0032460 A1 | 2/2016 | Schmiege et al. |
| 2016/0053366 A1* | 2/2016 | Stowell ............... C23C 14/35 |
| | | 204/192.15 |
| 2016/0053376 A1 | 2/2016 | Nam et al. |
| 2016/0064500 A1 | 3/2016 | Chen et al. |
| 2016/0104607 A1* | 4/2016 | Ruzic ............... H01J 37/3452 |
| | | 204/192.12 |
| 2016/0141202 A1 | 5/2016 | Xue et al. |
| 2016/0217981 A1 | 7/2016 | Nguyen et al. |
| 2016/0240385 A1 | 8/2016 | Citla et al. |
| 2016/0260896 A1 | 9/2016 | Gouk et al. |
| 2016/0293437 A1 | 10/2016 | Zhou et al. |
| 2016/0293438 A1 | 10/2016 | Zhou et al. |
| 2016/0300709 A1 | 10/2016 | Posseme et al. |

FOREIGN PATENT DOCUMENTS

| | | |
|---|---|---|
| JP | 2013-167353 A | 8/2013 |
| JP | 2013-253291 A | 12/2013 |
| JP | 2017-534750 A | 11/2017 |
| KR | 2007-0017362 A | 2/2007 |
| KR | 10-2016-0044977 A | 4/2016 |
| WO | 2016-028640 A1 | 2/2016 |

OTHER PUBLICATIONS

Kelly, P.J. and Arnell, R.D; "Magnetron sputtering: a review of recent developments and applications," Vacuum Surface Engineering, Surface Instrumentation & Vacuum Technology, Sep. 20,1999; 14 pages.

PCT/US2017/043930, "PCT Search Report", dated Nov. 8, 2017, 12 pages.

International Preliminary Report on Patentability dated in International Patent Application No. PCT/US2017/043930, 9 pages.

* cited by examiner

HIGH DENSITY, LOW STRESS AMORPHOUS CARBON FILM, AND PROCESS AND EQUIPMENT FOR ITS DEPOSITION

CROSS REFERENCE TO RELATED APPLICATIONS

This application claims the benefit of U.S. Provisional Patent Application No. 62/377,325, filed Aug. 19, 2016, the entire disclosure of which is incorporated by reference herein for all purposes.

TECHNICAL FIELD

The present disclosure applies broadly to the field of processes and equipment for depositing films, and the films themselves. More specifically, sputtering systems and methods for depositing high density, low stress amorphous carbon films on a workpiece are disclosed.

BACKGROUND

Integrated circuits and other semiconductor products are often fabricated on surfaces of substrates called "wafers." Semiconductor wafer sizes have increased while feature sizes have decreased significantly over the years, so that more integrated circuits with greater functionality can be harvested per wafer processed. Typical wafer diameters increased from about 2 or 3 inches in the 1970s to 12 inches or more in the 2010s. Over the same time frame, typical minimum feature sizes of commercial integrated circuits decreased from about 5 microns to about 0.015 microns. Processing smaller features while wafers grow larger requires significant improvements in many types of processing capabilities. For example, for lithographic systems to become capable of printing the smaller features, wafers have had to become much flatter as they have become larger, and film deposition and etch processes have had to improve in uniformity.

Some wafer processing includes etching of layers that are masked by photoresist, which can be patterned by projecting light through a stencil or mask. However, etching thick and/or multiple layers can erode photoresist, which can degrade precise geometric control of the etched layers. One technique used to maintain geometric control over etched layers is to pattern a "hardmask" layer atop the layer to be etched. The patterned hardmask layer can better withstand etching, as compared to photoresist, so that geometric control of the etched layers can be maintained.

Amorphous carbon has been considered for use as a hardmask layer, but present techniques for amorphous carbon deposition often result in films with one or more of low density, low percentage of bonds within the amorphous layer that are sp3 bonds, high hydrogen content and/or high stress. Each of these characteristics can be problematic. Sp3 bonds are the type of carbon-carbon bonds that are present in the diamond form of carbon, while sp2 bonds are the type of carbon-carbon bonds that are present in graphite. Low film density and/or low sp3 carbon-carbon bond percentage can result in poor etch selectivity with respect to underlying layers, which can defeat the purpose of using a hardmask. Also, some present systems for depositing amorphous carbon are chemical vapor deposition (CVD) systems that decompose hydrocarbon precursors, which results in high hydrogen content in the deposited carbon film. Hydrogen content of CVD films can be as high as 20% to 70%. This also promotes poor etch selectivity with respect to underlying layers, and can cause other process integration issues due to the tendency of hydrogen to migrate into adjacent structures. High stress can cause issues such as film peeling (causing particulate contamination that can, in turn, cause misprinting of etched features) and/or wafer warpage (which degrades wafer flatness, leading to lithography focus related issues and loss of geometric control in printing). Undesirably high temperatures may also occur during CVD processing. In many processes that deposit amorphous carbon, certain process changes aimed at process improvement such as improving density, sp3 carbon-carbon percentage and/or improving (that is, reducing) hydrogen content, tend to increase film stress.

SUMMARY

In an embodiment, a deposited amorphous carbon film includes at least 95% carbon, a percentage of sp3 carbon-carbon bonds present in the amorphous carbon film exceeds 30%, and a hydrogen content of the amorphous carbon film is less than 5%.

In an embodiment, a high power impulse magnetron sputtering system includes a process chamber, a pedestal configured to position a workpiece within the process chamber, a magnetron assembly, a gas supply system and a power supply that provides pulses of DC power to a plasma within the process chamber. The magnetron assembly includes a backing plate, first magnets that have their north poles coupled with the backing plate, a south pole piece coupled with south poles of each of the first magnets, second magnets that have their south poles coupled with the backing plate, a north pole piece coupled with north poles of each of the second magnets, with the north pole piece and the south pole piece spatially separated so as to project a magnetic field across one or more gaps between the north pole piece and the south pole piece, a magnetron assembly surround that is configured to envelop, and to circulate a heat exchange fluid around, the magnetron assembly, and a carbon target disposed on a surface of the magnetron assembly surround such that the magnetic field projects through the carbon target. The gas supply system provides a source gas to the process chamber. The power supply provides pulses of DC power to a plasma formed from the source gas within the process chamber. The pulses of DC power are supplied in pulses of 40 microseconds or less, and the pulses are repeated at a frequency of at least 4 kHz.

In an embodiment, a process of depositing an amorphous carbon film on a workpiece includes positioning the workpiece on a pedestal within a process chamber and positioning a magnetron assembly within a magnetron assembly surround adjacent to the process chamber. The magnetron assembly includes a south pole piece and a north pole piece arranged so that the north pole piece and the south pole piece project a magnetic field across one or more gaps between the north pole piece and the south pole piece. The method further includes coupling a carbon target with the magnetron assembly surround such that the magnetic field extends through the carbon target toward the workpiece, and the carbon target is electrically coupled with the magnetron assembly surround. The method further includes providing a source gas to the process chamber, and providing pulses of DC power to a plasma formed from the source gas within the process chamber. The pulses of DC power are supplied in pulses of 40 microseconds or less, that repeat at a frequency of at least 4 kHz.

DETAILED DESCRIPTION

Figure 1:
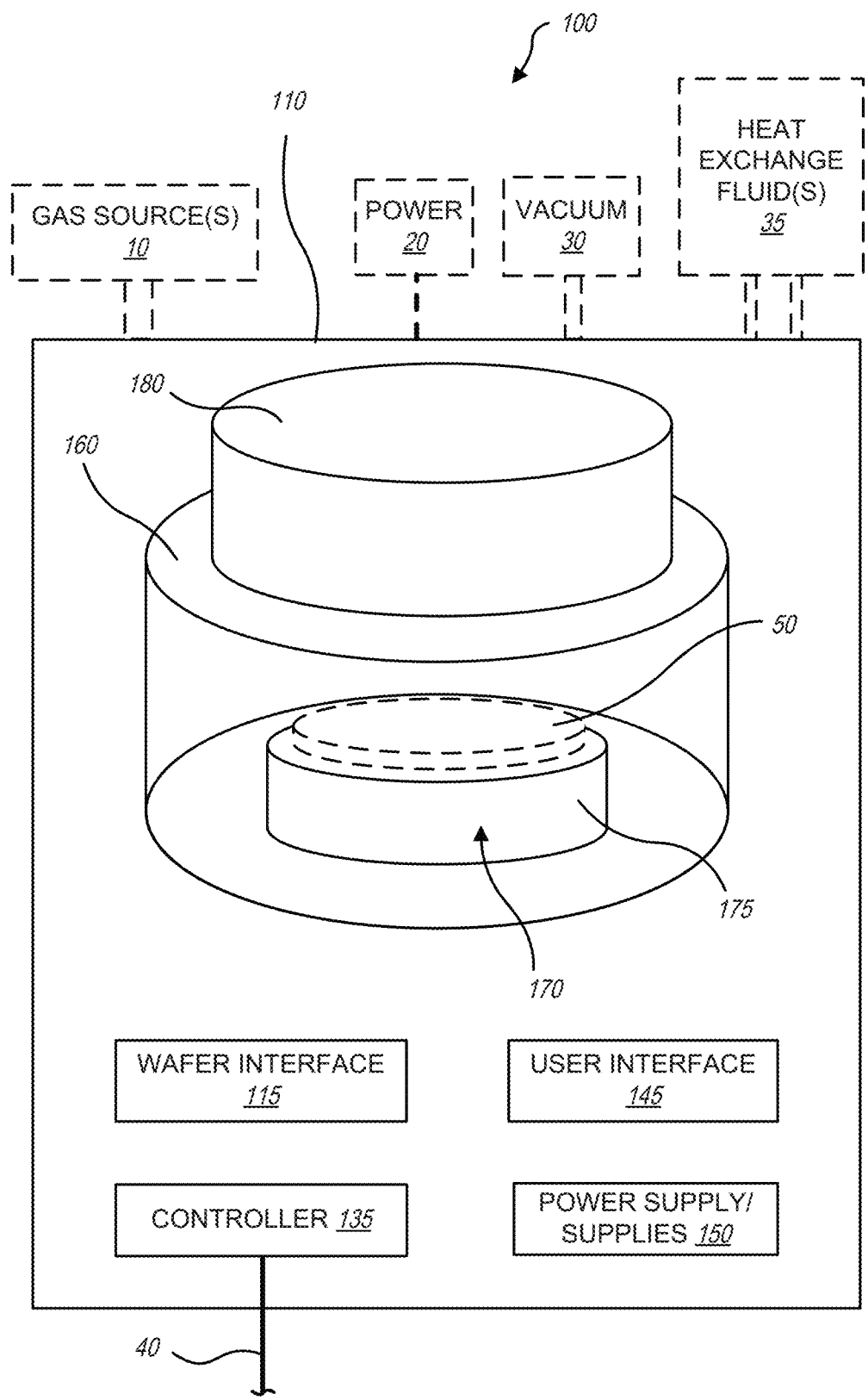
FIG. 1 schematically illustrates major elements of a processing system, according to an embodiment.

The present disclosure may be understood by reference to the following detailed description taken in conjunction with the drawings described below, wherein like reference numerals are used throughout the several drawings to refer to similar components. It is noted that, for purposes of illustrative clarity, certain elements in the drawings may not be drawn to scale. Specific instances of an item may be referred to by use of a numeral in parentheses (e.g., north pole piece 258(1) and south pole pieces 258(2)) while numerals without parentheses refer to any such item (e.g., pole pieces 258). In instances where multiple instances of an item are shown, only some of the instances may be labeled, for clarity of illustration.

Embodiments herein provide new and useful functionality for processing of wafers and other workpieces. Processes and equipment now described are capable of depositing films of amorphous carbon that simultaneously have high density, a high sp3 carbon-carbon bond percentage, low stress and are extremely low in hydrogen. FIG. 1 schematically illustrates major elements of a processing system 100. System 100 is a HiPIMS (High Power Impulse Magnetron Sputtering) system for depositing amorphous carbon, and includes custom hardware such as a sputtering apparatus 180, discussed below, to produce the film characteristics noted. System 100 is depicted as a single wafer, semiconductor wafer processing system, but it will be apparent to one skilled in the art that the techniques and principles herein are applicable to similar processing systems that process workpieces of other types, not necessarily wafers or semiconductors). It should also be understood that FIG. 1 is a diagram intended to illustrate selected, major elements of system 100 schematically; accordingly, an actual processing system will look different, will be arranged differently, and will likely contain additional elements as compared with system 100 as shown in FIG. 1.

Processing system 100 is serviced by one or more utilities such as process fluid(s) 10 (e.g., gas sources), external power 20, vacuum 30 and heat exchange fluid(s) 35. Processing system 100 includes a housing 110 and an interface 115 that receives workpieces 50 from external sources, and positions them within a process chamber 160. (Throughout the discussion below, workpieces 50 are assumed to be wafers, but any other type of workpiece may be processed.) Processing system 100 may also include a user interface 145, and a system controller 135 that typically includes a microprocessor, memory and the like, may take input from user interface 145 and/or other sources, and provides computer based control over the hardware elements of processing system 100. Controller 135 may interface with external networks and/or computers over one or more data links 40 that may be physical (wires or optical connectors) or wireless connections. Processing system 100 may also include one or more internal power supplies 150 that transform or condition power supplied by external power 20 for use by the hardware elements of the system.

Process chamber 160 receives each wafer 50 onto a pedestal or wafer chuck 170 that includes at least a puck 175 that supports wafer 50. Wafer 50 is physically positioned on, and in embodiments is heated, cooled and/or secured by, puck 175. Wafer chuck 170 is also, in embodiments, configured to manipulate wafer 50 for access to wafer handling tools. For example, in embodiments, wafer chuck 170 may raise or lower puck 175 to receive wafer 50 thereon, and subsequently lower or raise puck 175 to another height for processing, or the reverse. In these or other embodiments, wafer chuck 170 may include actuators that raise or lower wafer 50 relative to a top surface of puck 175, such as lift pins that can extend from or retract within puck 175, such that a wafer tool may be inserted between wafer 50 and the top surface. Wafer chuck 170 may also include electrical connections with puck 175 for electrostatic clamping of wafer 50. Wafer chuck 170 may also include fluid connections (e.g., to a circulating heat exchange fluid) for temperature control of puck 175.

Depositing films of amorphous carbon that simultaneously have high density, a high sp3 carbon-carbon bond percentage, low stress and are extremely low in hydrogen on workpieces other than wafers is also considered within the scope of the present disclosure. Thus, characterization of the chucks herein as "wafer chucks" for holding "wafers" should be understood as equivalent to chucks or pedestals for positioning workpieces of any sort, and "wafer processing systems" as similarly equivalent to any "processing systems."

Although FIG. 1 illustrates processing system 100 as including certain elements "inside" the outline that denotes a single housing 110, it is understood that some of these elements may be remotely situated, may be disposed in multiple housings, may exist in multiples within system 110, and/or may be shared with other processing systems. For example, housing 110 may include process chamber 160 and sputtering apparatus 180, with other elements such as the system controller 135, user interface 145 and power supplies 150 disposed at remote locations and connected by electronic, optical, radio frequency and/or free space optical methods. Similarly, although gas sources 10, power 20, vacuum 30 and heat exchange fluids 35 are illustrated as remotely situated, these elements could also be provided within housing 110. Multiple process chambers 160 may exist within a single system 100, and may be served by single or multiple instances of controller 135, user interface 145, and/or wafer interface 115. Housing 110 may be configured for "bulkhead" installation with a cleanroom wall, wherein certain portions of system 100 are accessible on a first side of the wall and other portions are accessible on a second side of the wall.

Sputtering apparatus 180 may be integrated with process chamber 160. Sputtering apparatus 180 includes a carbon target that is bombarded by a plasma, the action of which tears carbon atoms from the target; some of the carbon atoms deposit on wafer 50, while others of the carbon atoms deposit on other surfaces of process chamber 160. Sputtering apparatus 180 also includes a magnetron that focuses the plasma into a predetermined pattern against the carbon target, and optionally includes a mechanism that moves and/or rotates the magnetron within apparatus 180 so that the sputtering action on the target and the film coverage on wafer 50 are uniform, as explained further below.

Figure 2:
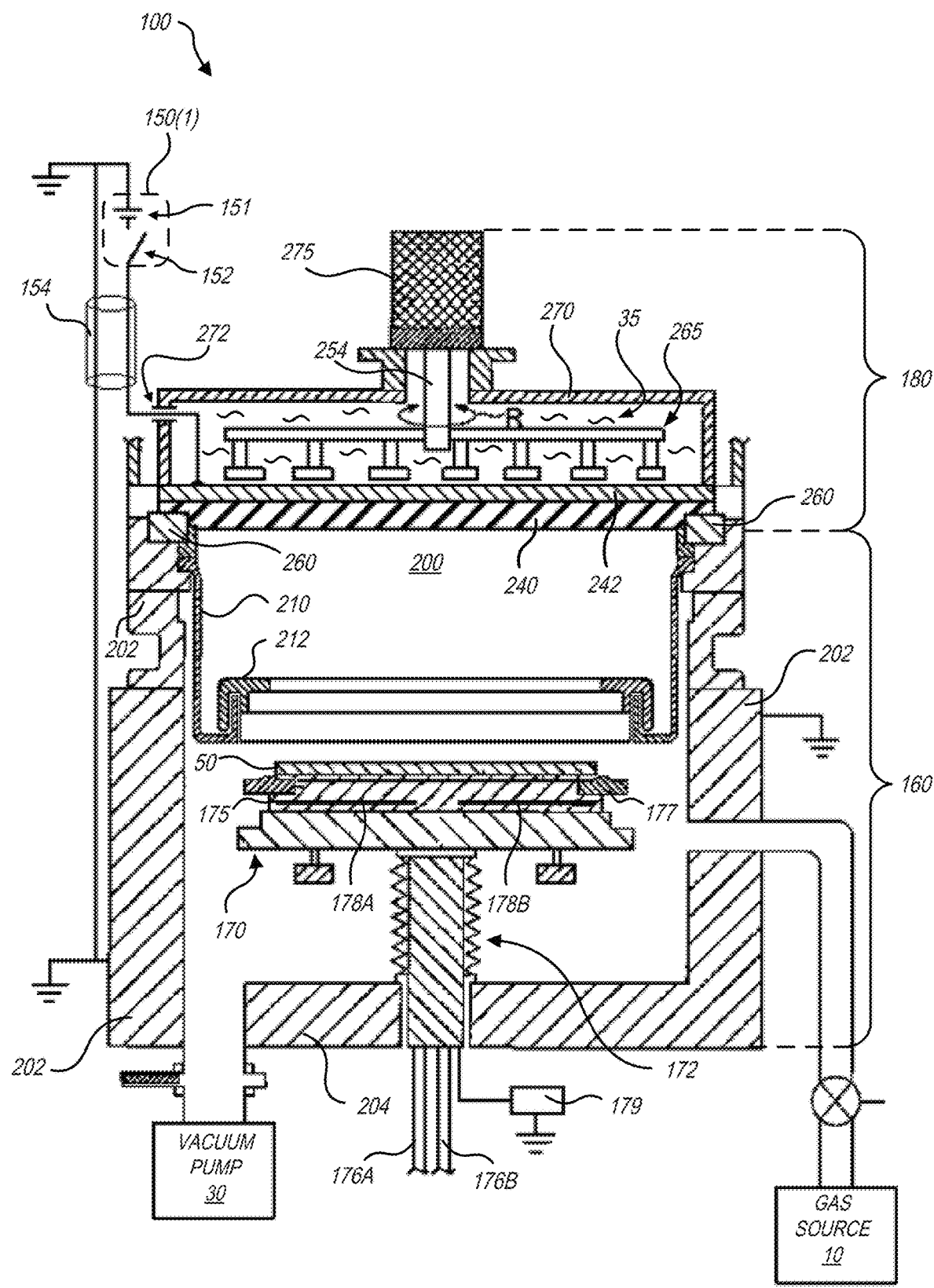
FIG. 2 is a more detailed schematic cross-sectional illustration of a process chamber and a sputtering apparatus as portions of the processing system of FIG. 1, according to an embodiment.

FIG. 2 is a more detailed schematic cross-sectional illustration of process chamber 160 and sputtering apparatus 180 as portions of processing system 100, and illustrating exemplary component parts thereof. FIG. 2 is not drawn to scale; certain components therein are exaggerated or diminished in size, not every instance of each component is shown and/or labeled, and not all internal connections among components are shown, for illustrative clarity. Similarly the divisions indicated between process chamber 160 and sputtering apparatus 180 are arbitrary; process chamber 160 and sputtering apparatus 180 may be physically implemented without a clear physical distinction between the parts thereof.

Within processing system 100, process chamber 160 includes sidewalls 202 and a bottom wall 204. Sidewalls 202 and bottom wall 204 are typically fabricated from stainless steel or aluminum (or alloys thereof); for example sidewalls 202 may include aluminum while bottom wall 204 includes stainless steel. When processing system 100 is a wafer processing system, sidewalls 202 may be generally cylindrical and bottom wall 204 may be generally round, to match the geometry of a wafer disposed on puck 175, however other shapes of sidewalls 202 and bottom wall 204 may be preferred when other workpieces are to be processed. Sidewalls 202 may form an opening (out of the cross sectional plane illustrated in FIG. 2) through which a workpiece such as wafer 50 may be moved in and out of process chamber 160. Sidewalls 202 and bottom wall 204 are typically maintained at ground potential. A grounded shield 210, that helps to confine a plasma formed during operation of sputtering apparatus 180, couples with sidewalls 202. A processing region 200, above the illustrated level of wafer 50, is configured to process wafer 50; a shaft 172 is capable of raising wafer 50 from the position shown to a processing position within region 200. As shaft 172 raises wafer 50 into the processing position, a deposition ring 177 lifts a cover ring 212 to further confine the plasma within region 200. Puck 175 may be substantially flat and parallel with a target 240 of sputtering apparatus 180, to provide thermal communication between wafer 50 and puck 175, and so that sputtering products from target 240 are received uniformly at wafer 50. Puck 175 may include a dielectric upper surface and may include electrodes such as electrodes 178A, 178B that are operable through application of a DC voltage to electrostatically clamp wafer 50 to puck 175 to maintain thermal communication and parallelism of wafer 50 with target 240. Chuck 170 may also include fluid connections 176A, 176B to circulate heat exchange fluid for temperature control of puck 175. Chuck 170 may also include circuitry 179 for establishing and/or monitoring electrical bias of puck 175 with respect to other components of chamber 160. Process chamber 160 is sealable such that it can be evacuated by a vacuum pump 30; a gas source 10 is also provided.

Sputtering apparatus 180 may be disposed above process chamber 160, as shown in FIG. 2, although this is not required. When sputtering apparatus 180 is disposed above process chamber 160, it may be configured as a lid assembly with a hinge or other mechanism that allows it to be removably lifted from process chamber 160 for cleaning or other maintenance purposes. An overall shape of sputtering apparatus 180 generally corresponds to a shape of process chamber 160 (e.g., round, when wafer 50 is the intended workpiece). Sputtering apparatus includes target 240, a magnetron assembly 265, a magnetron surround 270 and an optional motor 275. Target 240 is typically formed of the graphite form of carbon (e.g., the carbon is bonded with sp2 bonds) and is bonded to a metallic plate that couples with peripheral walls of magnetron surround 270.

Magnetron surround 270 and target 240 operably couple with a HiPIMS pulsed direct current (DC) power supply 150(1). In embodiments, power supply 150(1) provides pulses of extremely high DC power to target 240 with respect to process chamber 160. For example, while power supply 150(1) operates, a DC voltage 151 is generated, and a switch 152 closes briefly, providing DC power into pulses that are less than 40 microseconds in duration. If a high pulse frequency is used, pulse length may be 35 microseconds, 33 microseconds, 30 microseconds, 25 microseconds, 20 microseconds, durations intermediate to these values, or shorter durations. Closure of switch 152 repeats at intervals, so that power supply 150(1) provides pulses of power delivered at a frequency that is generally between 20 Hz to over 40 kHz. That is, the actual pulse repetition frequency may be set at 20 Hz, 40 Hz, 75 Hz, 100 Hz, 200 Hz, 400 Hz, 500 Hz, 800 Hz, 1 kHz, 2 kHz, 4 kHz, 5 kHz, 8 kHz, 10 kHz, 15 kHz, 20 kHz, 25 kHz, 30 kHz, 35 kHz, 40 kHz or higher, or frequencies intermediate to those specifically noted. The duration of the power pulses and/or the frequency of repetition of the pulses may be established through hardware or firmware of power supply 150(1), or may be controlled through system controller 135 (FIG. 1). DC voltage 151 is typically in the range of −500V to −2000V, and often in the range of −1200V to −1600V. HiPIMS power supplies often provide high power DC pulses of a given pulse duration, such that increasing the frequency with which the pulses are delivered increases the net duty cycle, that is, provides a higher ratio of time that the high DC power is on to the time that the high DC power is off. The higher net duty cycle improves both deposition time and film quality, as discussed below.

It may be advantageous to provide connections between power supply 150(1) and magnetron surround 270 that are electrically as clean as possible, to maximize the amount of power delivered in a very brief pulse. Because the current driven by power supply 150(1) may be on the order of 100 A during pulses, cable 154 that brings the power from power supply 150(1) to target 240 may be a custom cable featuring an inductance in a range of 0.02 nH/ft to 75 nH/ft. The length of cable 154 shown in FIG. 2 is not to scale; cable 154 may be very short or much longer (e.g., so that a single power supply 150(1) can be located at any distance from sputtering apparatus 180 and/or process chamber 160). For example, power supply 150(1) may be disposed remotely from processing system 100 (and in some cases a single power supply 150(1) may be a shared resource across several processing systems 100). At sputtering apparatus 180, the conductor that carries the power pulses enters magnetron surround 270 through a feedthrough 272 to connect with backing plate 242 and target 240.

As shown in FIG. 2, an isolator 260 insulates magnetron surround 270 and target 240 from sidewalls 202 of process chamber 160 so that power supply 150(1) can bias magnetron surround 270 and target 240 with respect to process chamber 160. Magnetron surround 270 and at least a backing plate 242 of target 240 form an enclosure through which a heat exchange fluid 35 passes to remove heat generated by target 240 and/or components of magnetron assembly 265 during operation, as discussed below. Heat exchange fluid 35 may be water or a glycol/water mix, and may be supplied at a temperature of 10 C to 25 C, or more specifically within a range of 15 C to 22 C.

Figure 3:
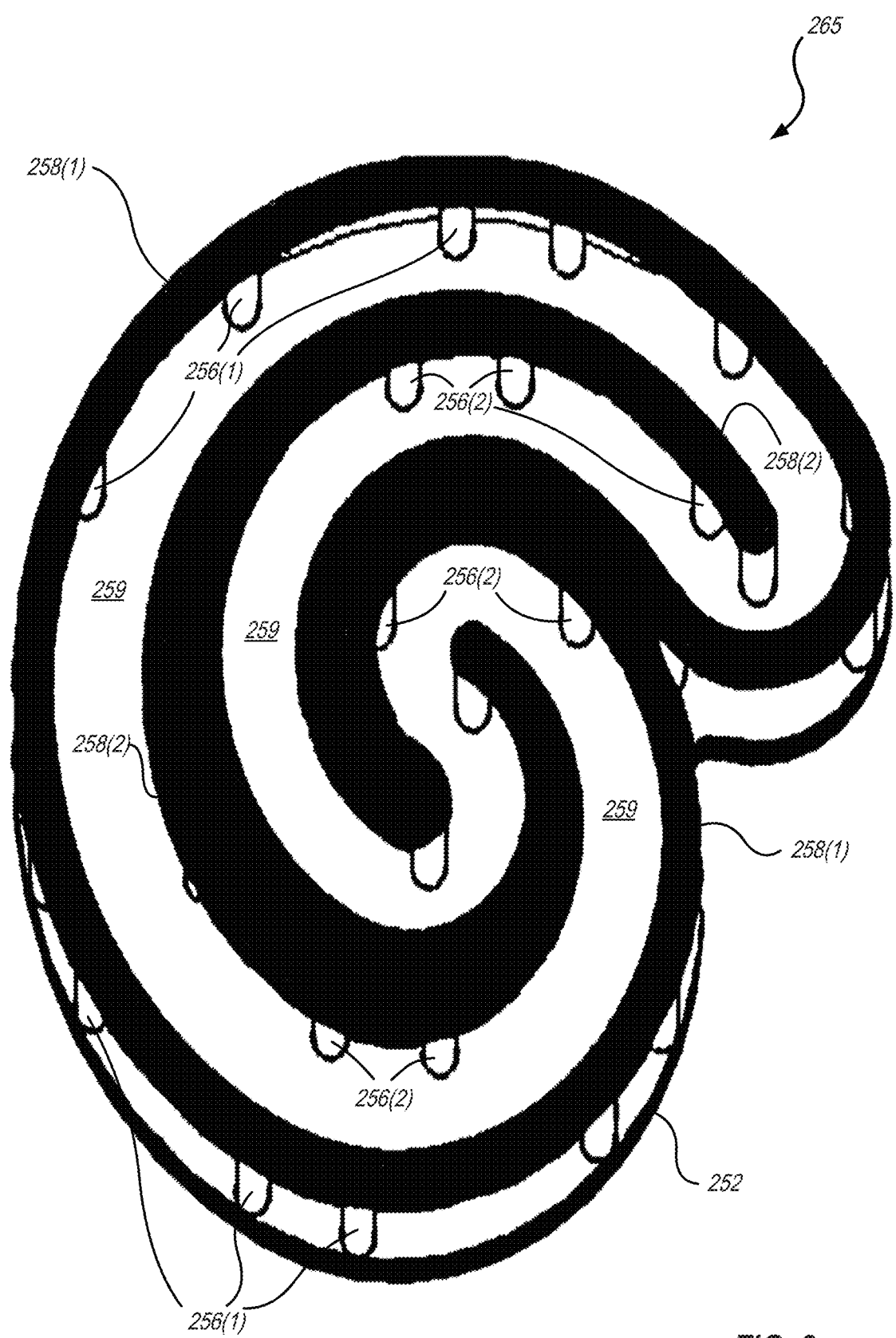
FIG. 3 illustrates the magnetron assembly 265 shown in FIG. 2, in still greater detail, according to an embodiment.

FIG. 3 illustrates magnetron assembly 265 in greater detail, in an angled view from below as compared with the side view shown in FIG. 2. A base plate 252 connects with a rod 254 (hidden in the view of FIG. 3, but shown in FIG. 2). When present, optional motor 275 is capable of rotating rod 254 and magnetron assembly 265 in a direction noted as R in FIG. 2. A plurality of high strength magnets (e.g., neodymium iron boride magnets) 256(1), 256(2) extend between pole pieces 258(1), 258(2) and base plate 252. Magnets 256(1), 256(2) are alike but placed in sets having opposite polarity from one another. That is, for example most or all of magnets 256(1) have their south poles facing base plate 252 and their north poles facing north pole piece 258(1), and most or all of magnets 256(2) have their north poles facing base plate 252 and their south poles facing south pole piece 258(2), or vice versa. (In certain embodiments, some magnets face in the opposite direction as compared with other magnets attached to the same pole piece, for the purpose of locally altering the magnetic fields.) Thus, magnetron assembly 265 establishes a pattern of magnetic field lines between north and south pole pieces 258(1), 258(2). The spiral patterns formed by gaps between pole pieces 258 may be referred to as racetrack 259.

When installed in proximity to target 240, the magnetic field lines extend through target 240 into processing region 200 so that the plasma generated therein is urged into proximity to target 240. In cases where magnetron assembly 265 is static (that is, rod 254 does not rotate magnetron assembly 265) the plasma will be confined to areas within processing region 200 that are directly across the surface of target 240 from racetrack 259, such that the target material will erode in a pattern matching racetrack 259. However, in most cases motor 275 will drive rod 254 so that magnetron assembly 265 rotates, sweeping the magnetic fields of magnetron assembly 265 across target 240, promoting deposition uniformity and even wear of target 240. In embodiments, magnetron assembly 265 rotates at a rate that is sufficient to provide at least several revolutions during each deposition cycle, such as a rate of 40 to 150 revolutions per minute, or more specifically 40, 50, 65, 80, 100, 115, 130 or 150 revolutions per minute.

In use, a workpiece such as wafer 50 is loaded onto chuck 170 and brought to a process position within process chamber 160. The process position of wafer 50 is typically within the range of 20 to 100 mm from target 240, such as for example 20, 30, 40, 50, 60, 70, 80 or 100 mm from target 240, and may be adjustable within a range (e.g., may be set at any 1 mm increment from 40 to 60 mm). Process chamber 160 is at least partially evacuated by vacuum pump 30, and gas source 10 admits a process gas therein. At least power supply 150(1) provides power to magnetron surround 270 and target 240, and a plasma forms from the process gas within process chamber 160. The magnetic field from magnetron assembly 265 concentrates the plasma near target 240, as explained above. Energetic atoms from the plasma strike and knock carbon atoms out of target 240. Some of the carbon atoms land on the workpiece and form a film thereon.

The present inventors have found a combination of process conditions that unexpectedly provides a deposited amorphous carbon film with high density, high sp3 carbon-carbon bond percentage, low hydrogen content and low stress. For example, density of the deposited amorphous carbon film may be between 2.0-2.4 grams/cm$^3$. Sp3 carbon-carbon bond percentage can be higher than 30%, and in some cases, higher than 40%. (Sp3 content can be calculated from a Raman shift spectrum of a deposited film by deconvoluting the G and D peaks of the film, determining the wavenumber $\omega G$ of the G peak in cm$^{-1}$, and using the formula: Sp3 content=0.24−48.9 ($\omega G/10000$−0.1580).) Related film parameters such as Young's modulus and hardness of the film are also high, as they correlate to density and sp3 carbon-carbon bond percentage. The deposited amorphous carbon film may have a Young's modulus exceeding 190 GPa (sometimes exceeding 200 GPa) and a hardness exceeding 17 GPa (sometimes exceeding 18 GPa). Because the amorphous carbon film is generated by sputtering a carbon target (e.g., not by decomposition of a hydrocarbon) the amorphous carbon film is at least 95% carbon, often 98% or 99% carbon, and hydrogen content may be very low, for example, less than 5%, less than 2% or less than 1%. Stress in the amorphous carbon film is also low as compared with amorphous carbon films having equivalent density that are deposited by other means. Stress in the film remains related to the thickness of the film, with thinner films exhibiting relatively higher stress than thicker films. For example, films deposited using the present techniques that are within a thickness range of 800 Å to 1200 Å may have a compressive stress that is less than 350 MPa or sometimes less than 300 MPa, while films within a thickness range of 0.8 μm to 1.2 μm may have a compressive stress that is less than 300 MPa, sometimes less than 240 MPa or less than 200 MPa.

HiPIMS deposition tends to heat both target 240 and wafer 50. However, it is believed that keeping target 240 and/or wafer 50 cool during deposition are advantageous for film quality, possibly because the wafer and film will not undergo a large temperature change to revert to room temperature after the deposition is complete. Both target 240 and/or wafer 50 can be maintained at cooler temperatures by operating power supply 150(1) in a cyclic mode, alternating "on-periods" (when HiPIMS deposition occurs) with "off-periods." Here, the on-periods are time periods on the order of seconds that the HiPIMS power supply cycles with the pulse lengths and frequencies discussed above, not the brief moments between HiPIMS power pulses. The off-periods are periods of time when no deposition occurs. Using the cyclic mode, in the on-periods, heat exchange fluid 35 in magnetron surround 270 reduces the temperature of target 240, and the cooling apparatus within puck 175 reduces the temperature of wafer 50. The present inventors have found that it is important to cool both puck 175 and target 240. Cooling only puck 175, but allowing target 240 to increase in temperature, may result in heat radiating from target 240 back to workpiece 50 on puck 175. Also, high temperature may damage target 240. Typical cyclic mode parameters alternate on-periods of 30 seconds to 2 minutes, with off-periods of 5 seconds to one minute. Cooling efficacy of both magnetron surround 270 and puck 175 may affect the length of off-periods needed for cooling; that is, when the respective cooling systems are capable of cooling rapidly, the off-periods can be shortened. Increasing the net duty cycle during which the HiPIMS DC power is on, for example by increasing frequency with which fixed-duration DC pulses are delivered, also appears to increase the need for cooling. Typical setpoints for the temperature of puck 175 may be within the range of −20 C to 200 C, and in particular within the range of −20 C to 50 C. Process controls for implementing the cycling of power supply 150(1) and setpoints for temperature control of magnetron surround 270 and puck 175 may be implemented through system controller 135 (FIG. 1). A film with high density and high sp3 carbon-carbon bond percentage can be generated using the cyclic mode, while maintaining low stress in the film.

Another significant factor contributing to high sp3 bond percentage in the deposited film is use of krypton as at least part of the source gas from which the plasma is formed. Argon is typically used as a source gas for sputtering processes, but krypton is much more expensive. But krypton, while expensive, has about double the atomic weight of argon. The higher atomic weight of krypton provides higher kinetic energy with each impact of a source gas atom upon target 240, so as to efficiently dislodge carbon atoms from target 240. Similarly, because of the higher kinetic energy per impact, it is believed that krypton increases a percentage of carbon atoms that are dislodged as single atoms, rather than bonded multiples. Reducing the number of carbon atoms coming from target 240 as sp2-bonded multiples, helps raise the percentage of carbon sp3 bonds in the resulting film.

Figure 4:
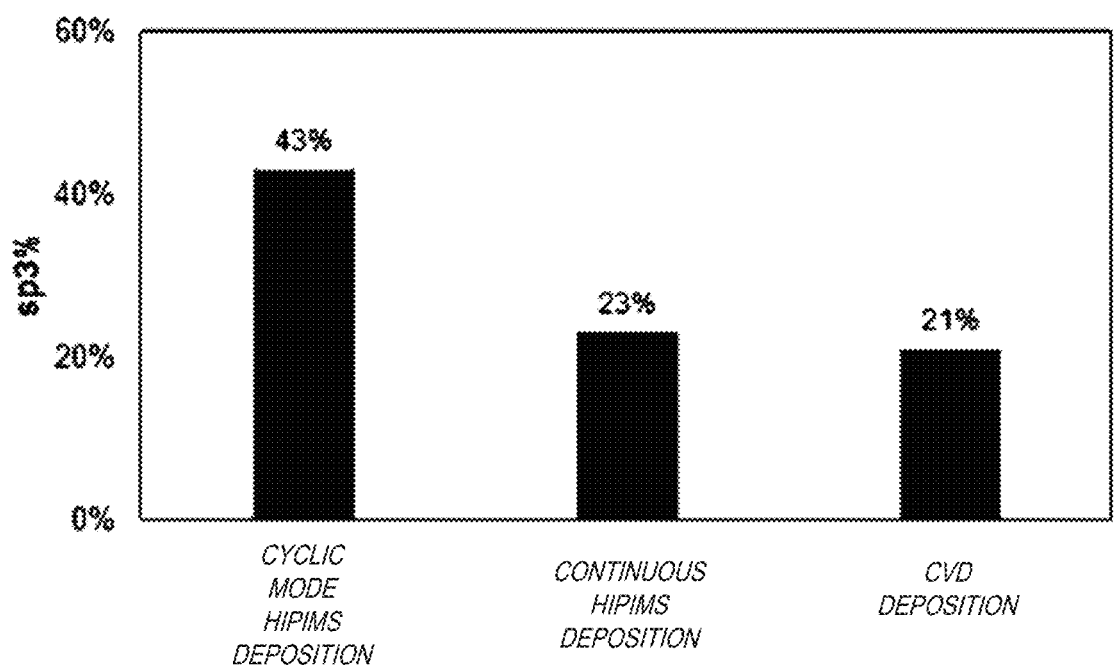
FIG. 4 is a bar chart illustrating an sp3 carbon-carbon bond percentage increase in films deposited using HiPIMS deposition using a cyclic mode, relative to amorphous carbon films that are deposited using continuous HiPIMS deposition, or by chemical vapor deposition (CVD), according to an embodiment.

FIG. 4 is a bar chart illustrating the sp3 carbon-carbon bond percentage increase in films deposited using HiPIMS deposition using cyclic mode, relative to amorphous carbon films that are deposited using continuous HiPIMS deposition, or by chemical vapor deposition (CVD). The sp3 carbon-carbon bond percentages are extracted from a Raman spectrum of each film, as discussed above.

Figure 5:
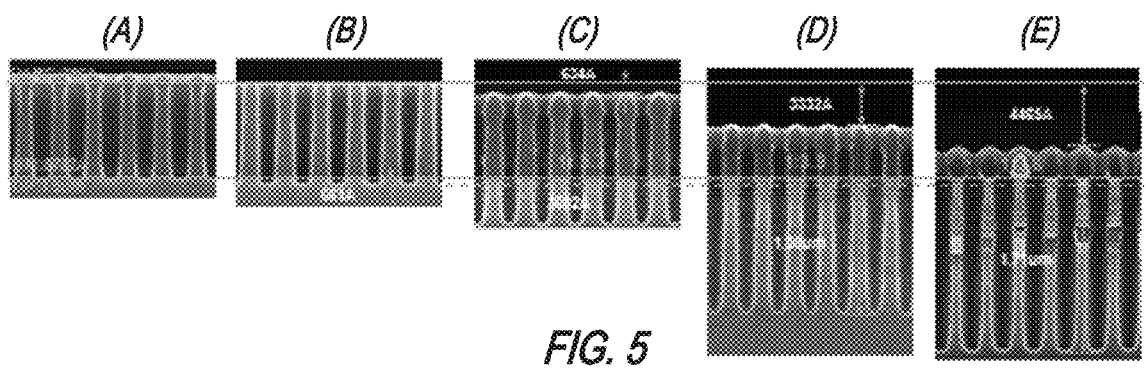
FIGS. 5 and 6 show scanning electron microscope (SEM) cross-sections that illustrate the superior performance of an amorphous carbon film deposited according to the techniques herein, as compared with performance of a CVD amorphous carbon film, according to an embodiment.
Figure 6:
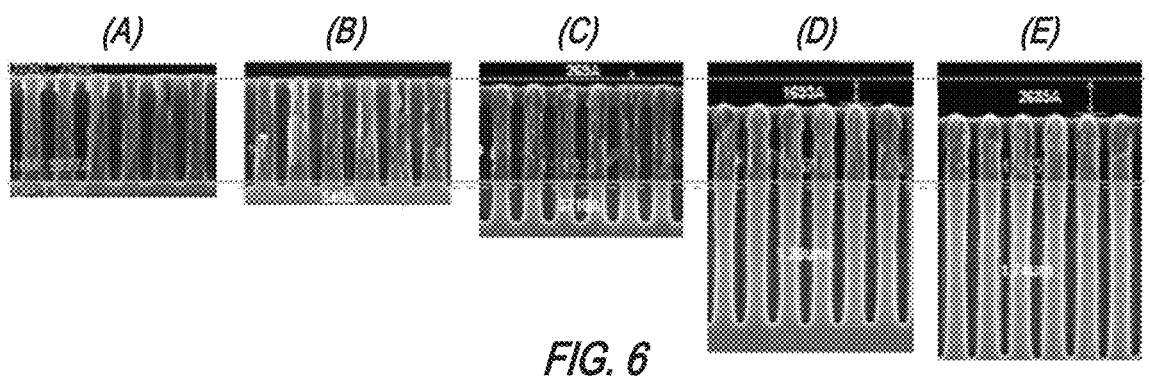
Figure 7:
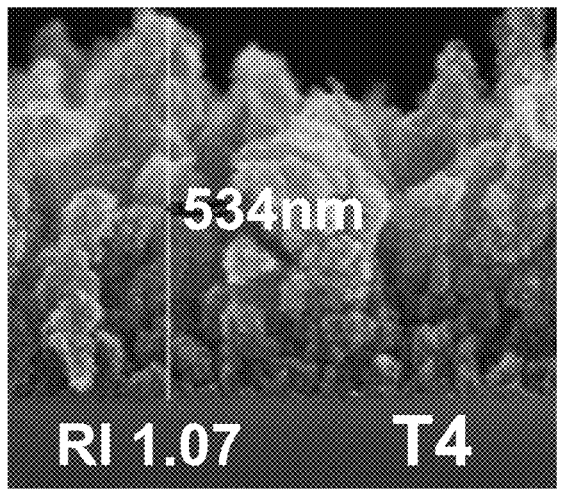
FIGS. 7, 8, 9 and 10 are SEM micrographs that illustrate how film granularity and refractive index vary with deposition temperature, according to embodiments.
Figure 8:
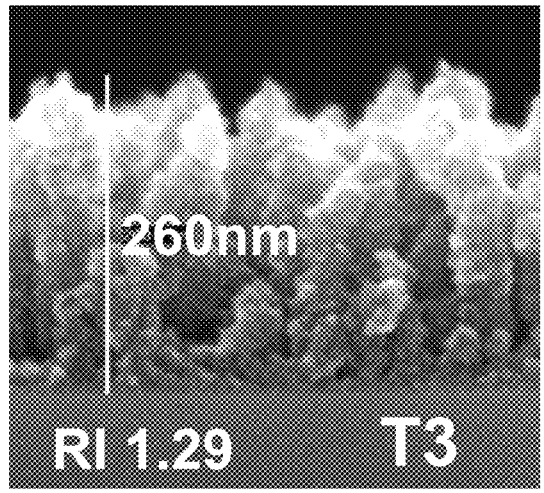
Figure 9:
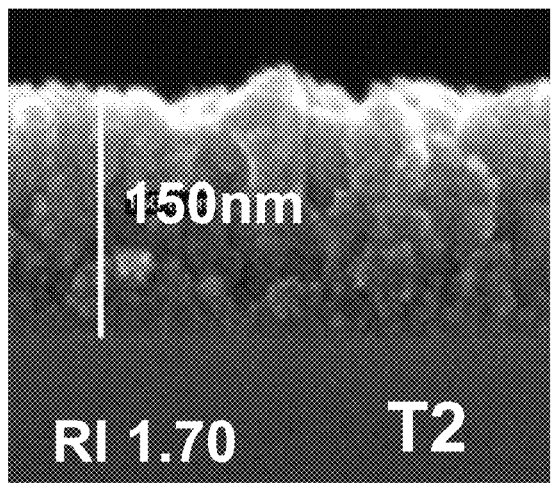
Figure 10:
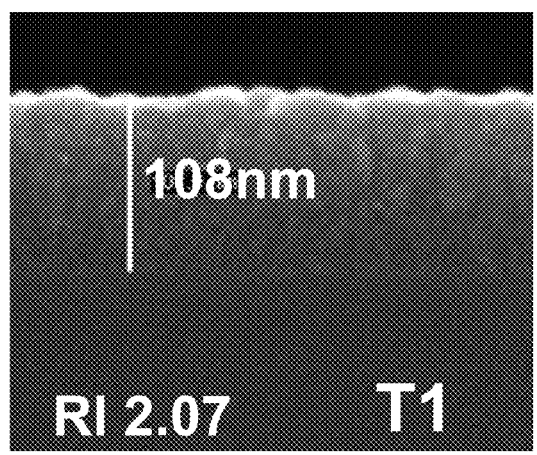

FIGS. 5 and 6 show scanning electron microscope (SEM) cross-sections that illustrate the superior performance of an amorphous carbon film deposited according to the techniques herein, as compared with performance of a CVD amorphous carbon film. HiPIMS films deposited according to the techniques herein, and CVD films, were used as hardmask layers for deep etching of oxide-polysilicon (OP) layers to form contact holes. Thicknesses of the HiPIMS and CVD hardmask layers and the OP layers were comparable, and the composition of the OP layers and etch recipes used were identical, for the HiPIMS and CVD samples. In each of the series shown in FIGS. 5 and 6, SEM micrograph (A) depicts an amorphous carbon hardmask layer that has been masked (with identical sized and shaped patterns) using photoresist, and etched through the hardmask layer only. In each series, micrograph (B) depicts the structure after the photoresist is removed and after 10 seconds of oxide-polysilicon etch; micrograph (C) depicts the structure after 60 seconds of oxide-polysilicon etch; micrograph (D) depicts the structure after 240 seconds of oxide-polysilicon etch; and micrograph (E) depicts the structure after 240 seconds of oxide-polysilicon etch. Reference lines that extend through all micrographs (A) through (E) in each series denote the original surface and bottom of the hardmask layer. Where measurable, micrographs (B) through (E) indicate depth of removal of the OP layer and the hardmask layer, and the ratio of the two, that is, the etch selectivity of the hardmask layer over the OP layer.

The removal depths of the hardmask and OP layers, and the corresponding etch selectivities, are summarized in Table 1 below. One skilled in the art will appreciate not only the superiority of the HiPIMS hardmask layer as measured by selectivity that is nearly double that of the selectivity for the CVD hardmask layer, but also the fact that dimensional stability is maintained much better by the HiPIMS layer than the CVD layer (that is, the etched OP features remain nearly as wide as the original pattern in the hardmask layer, FIG. 6, as compared with the corresponding OP features shown in FIG. 5).

TABLE 1

Etch removal amounts and selectivities for HiPIMS and CVD hardmask films over oxide polysilicon (OP) layers

| Micrograph | Hardmask deposition | OP layer removal | Hardmask removal | Selectivity hardmask:OP |
| --- | --- | --- | --- | --- |
| 5 (B) | CVD | 661 Å | Not measurable | Not measurable |
| 5 (C) | CVD | 3602 Å | 634 Å | 1:5.7 |
| 5 (D) | CVD | 1.30 μm | 3332 Å | 1:3.9 |
| 5 (E) | CVD | 1.71 μm | 4465 Å | 1:3.8 |
| 6 (B) | HiPIMS | 540 Å | Not measurable | Not measurable |
| 6 (C) | HiPIMS | 3710 Å | 269 Å | 1:13.8 |
| 6 (D) | HiPIMS | 1.20 μm | 1693 Å | 1:7.0 |
| 6 (E) | HiPIMS | 1.74 μm | 2685 Å | 1:6.5 |

FIGS. 7, 8, 9 and 10 are SEM micrographs that illustrate how film granularity and refractive index vary with deposition temperature. Each of FIGS. 7, 8, 9 and 10 shows an amorphous carbon layer deposited on an underlying structure (featureless gray area at the bottom of each micrograph). The carbon layers deposited in FIGS. 7, 8, 9 and 10 were deposited at successively lower temperatures T4, T3, T2 and T1 and respectively. A white bar on each micrograph indicates a measured thickness of the deposited layer. Refractive index (RI) of each sample is provided in the lower left corner of each micrograph. The FIG. 10 sample, deposited at the lowest temperature T1, is the smoothest and has the highest RI, while the FIG. 7 sample, deposited at the highest temperature T4, is the grainiest and has the lowest RI. The FIG. 10 sample would generally be judged the most suitable for a semiconductor hardmask application, based on its highest density (as inferred from its highest RI) as well as its smooth morphology.

Figure 11:
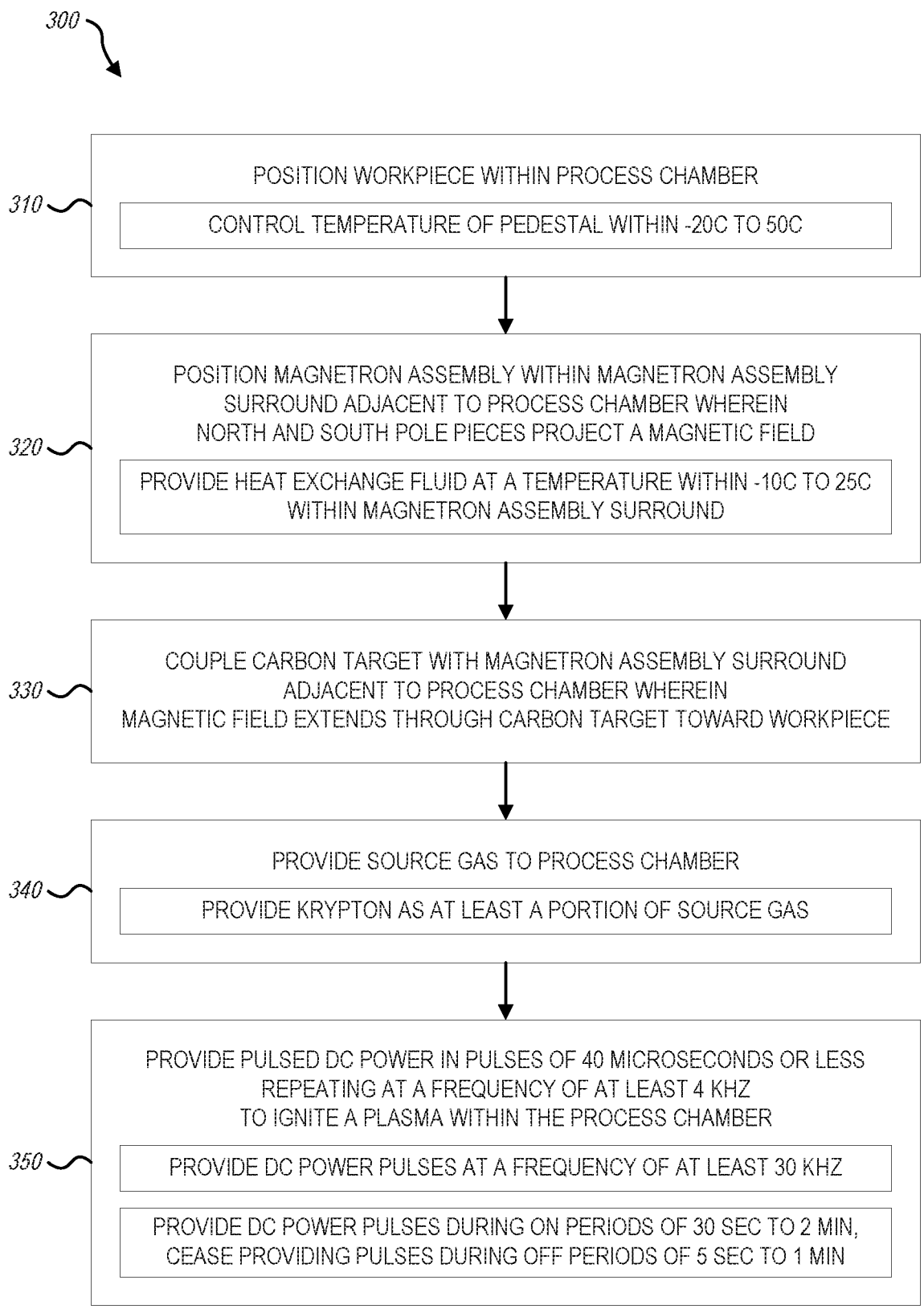
FIG. 11 is a flowchart of a method of depositing an amorphous carbon film on a workpiece, in accord with an embodiment.

FIG. 11 is a flowchart of a method 300 of depositing an amorphous carbon film on a workpiece. In 310, the workpiece is positioned within a process chamber. An example of 310 is positioning wafer 50 on pedestal or wafer chuck 170, FIG. 2. Optionally, a temperature of the pedestal is controlled within a range of −20 C to 50 C. In 320, a magnetron assembly is positioned within a magnetron assembly surround adjacent to the process chamber, such that north and south pole pieces of the magnetron assembly project a magnetic field. An example of 320 is positioning magnetron assembly 265 within magnetron assembly surround 270, FIG. 2. Optionally, a heat exchange fluid is provided at a temperature within the range of −10 C to 25 C, within the magnetron assembly surround, to regulate temperature of the magnetron assembly. An example of this is providing heat exchange fluid 35 within magnetron assembly surround 270, FIG. 2. In 330, a carbon target couples with the magnetron assembly surround adjacent to the process chamber, such that the magnetic field from the magnetron assembly extends through the carbon target. An example of 330 is coupling carbon target 240 with a backing plate 242, FIG. 2, with carbon target 240 being adjacent to process chamber 160, an opposite side of backing plate 242 being adjacent to magnetron assembly 265 within magnetron assembly surround 270. In 340, a source gas is provided to the process chamber. Optionally, krypton is at least a portion of the source gas. An example of 340 is providing a source gas to process chamber 160, FIG. 2.

In 350, pulses of DC power are provided in pulses of 40 microseconds or less, repeating at a frequency of at least 4 kHz, to a plasma within the process chamber. An example of 350 is HiPIMS power supply 150(1) providing pulses of DC power to a plasma within process chamber 160, FIG. 2. Optionally, the pulses of DC power are provided at a higher frequency, such as but not limited to at least 30 kHz. Also, optionally, the DC power is pulses are provided during on-periods of 30 seconds to 2 minutes, alternating with off-periods of 5 seconds to one minute, where the DC power pulse turns off, to promote cooling of the workpiece and the carbon target.

Having described several embodiments, it will be recognized by those of skill in the art that various modifications, alternative constructions, and equivalents may be used without departing from the spirit of the invention. Additionally, a number of well-known processes and elements have not been described in order to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and equivalents thereof known to those skilled in the art, and so forth. Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

We claim:

1. A high power impulse magnetron sputtering system, comprising:
   a process chamber;
   a pedestal configured to position a workpiece within the process chamber;
   a magnetron assembly including:
      a backing plate,
      a plurality of first magnets, wherein north poles of each of the first magnets couple with the backing plate,
      a south pole piece coupled with south poles of each of the first magnets,
      a plurality of second magnets, wherein south poles of each of the second magnets couple with the backing plate, and
      a north pole piece coupled with north poles of each of the second magnets, wherein the north pole piece and the south pole piece are spatially separated so as to project a magnetic field across one or more gaps between the north pole piece and the south pole piece;
   a magnetron assembly surround that is configured to envelop, and to circulate a heat exchange fluid around, the magnetron assembly;
   a carbon target disposed on a surface of the magnetron assembly surround such that the magnetic field projects through the carbon target;
   a gas supply system for providing a source gas to the process chamber; and
   a power supply that provides pulses of DC power to a plasma formed from the source gas within the process chamber, wherein:
   the pulses of DC power are supplied in pulses of 40 microseconds or less,
   the pulses are repeated at a frequency of at least 4 kHz, and
   the power supply is configured to operate in cycles, each cycle comprising:
      an on-period during which the pulses repeat at the frequency, the on-period being 30 seconds to 2 minutes in duration; and
      an off-period during which the pulses cease, the off-period being of 5 seconds to one minute in duration.

2. The high power impulse magnetron sputtering system of claim 1, wherein the source gas comprises krypton.

3. The high power impulse magnetron sputtering system of claim 1, wherein the pedestal is configured to control a temperature of the workpiece within a range of −20 C to 200 C.

4. The high power impulse magnetron sputtering system of claim 3, wherein the pedestal is configured to control the temperature of the workpiece within a range of −20 C to 50 C.

5. The high power impulse magnetron sputtering system of claim 1, wherein the frequency is at least 30 kHz.

6. The high power impulse magnetron sputtering system of claim 1, wherein the magnetic field is configured to project through the carbon target so as to urge the plasma into proximity with the carbon target, and the north and south pole pieces are configured to form the magnetic field into a spiral pattern.

7. The high power impulse magnetron sputtering system of claim 6, wherein the magnetron assembly is mounted on a motor and is configured to rotate so that the spiral pattern rotates over the carbon target while the pulses of DC power are supplied.

8. The high power impulse magnetron sputtering system of claim 7, further comprising a system controller, that is configured to control the motor so that the spiral pattern rotates over the carbon target at least three full revolutions during each of the on-period cycles.

9. The high power impulse magnetron sputtering system of claim 8, wherein the system controller is configured to control the motor so that the spiral pattern rotates at a rate between 40 and 150 revolutions per minute.

* * * * *